United States Patent
Joi et al.

(10) Patent No.: US 10,163,695 B1
(45) Date of Patent: Dec. 25, 2018

(54) SELF-FORMING BARRIER PROCESS

(71) Applicant: Lam Research Corporation, Fremont, CA (US)

(72) Inventors: Aniruddha Joi, San Jose, CA (US); Yezdi Dordi, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/635,117

(22) Filed: Jun. 27, 2017

(51) Int. Cl.
*H01L 23/532* (2006.01)
*H01L 21/768* (2006.01)
*H01L 23/522* (2006.01)

(52) U.S. Cl.
CPC .. *H01L 21/76858* (2013.01); *H01L 21/76877* (2013.01); *H01L 23/5226* (2013.01); *H01L 23/53238* (2013.01)

(58) Field of Classification Search
CPC ......... H01L 2924/0002; H01L 2924/00; H01L 21/76834; H01L 21/76843; H01L 21/76877; H01L 23/53238; H01L 41/0815
See application file for complete search history.

(56) References Cited

U.S. PATENT DOCUMENTS

| | | | |
|---|---|---|---|
| 6,319,387 B1 | 11/2001 | Krishnamoorthy et al. | |
| 6,368,966 B1 | 4/2002 | Krishnamoorthy et al. | |
| 6,486,533 B2 | 11/2002 | Krishnamoorthy et al. | |
| 6,515,368 B1 * | 2/2003 | Lopatin ............... | H01L 21/2885 257/751 |
| 6,717,236 B1 * | 4/2004 | Lopatin ................... | C25D 3/58 257/586 |

* cited by examiner

*Primary Examiner* — Jaehwan Oh
(74) *Attorney, Agent, or Firm* — Martine Penilla Group, LLP

(57) ABSTRACT

A method is provided, including the following operations: performing a deposition process on a substrate, the deposition process configured to deposit a copper layer in a feature on the substrate, the copper layer being doped with zinc at an atomic percentage less than approximately 30 percent; after depositing the copper layer, annealing the substrate, wherein the annealing is configured to cause migration of the zinc to an interface of the copper layer and an oxide layer of the substrate, the migration of the zinc producing an adhesive barrier at the interface that inhibits electromigration of the copper layer.

23 Claims, 18 Drawing Sheets

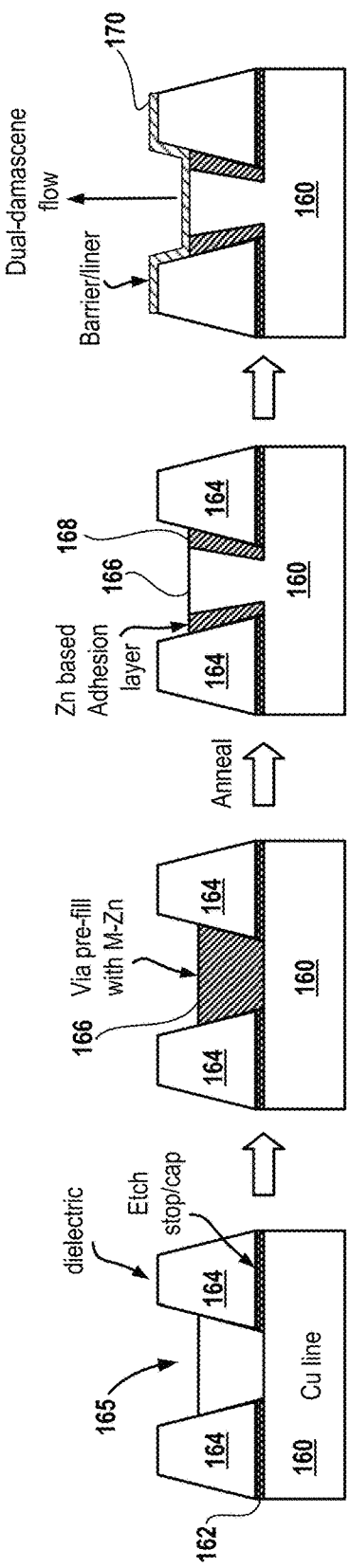

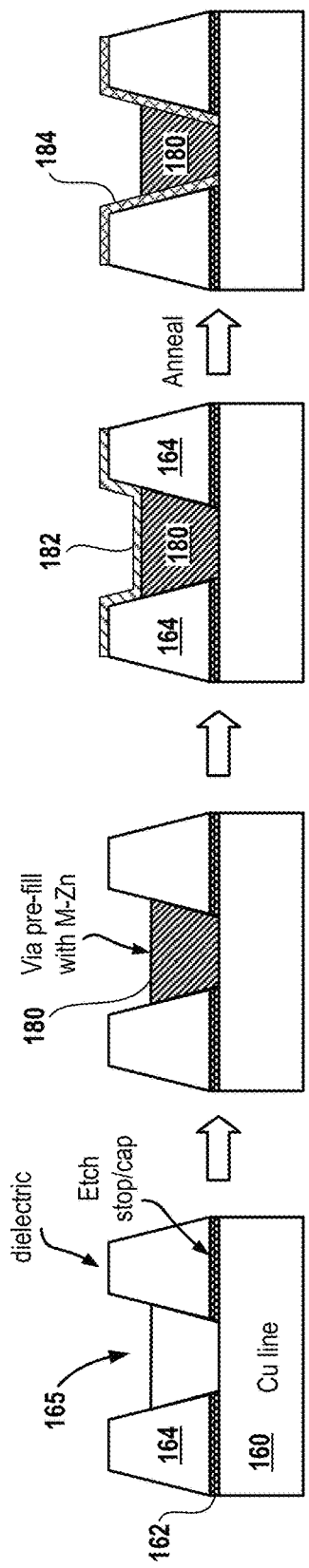

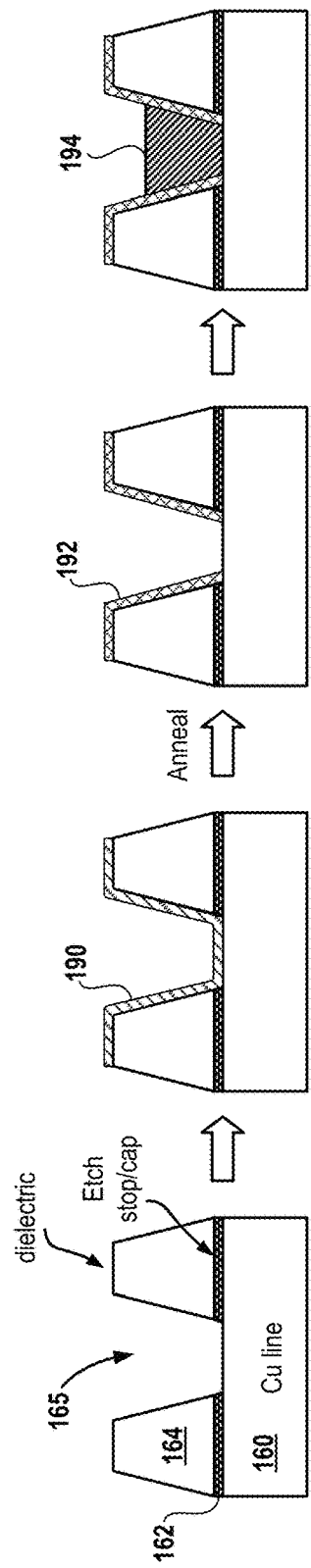

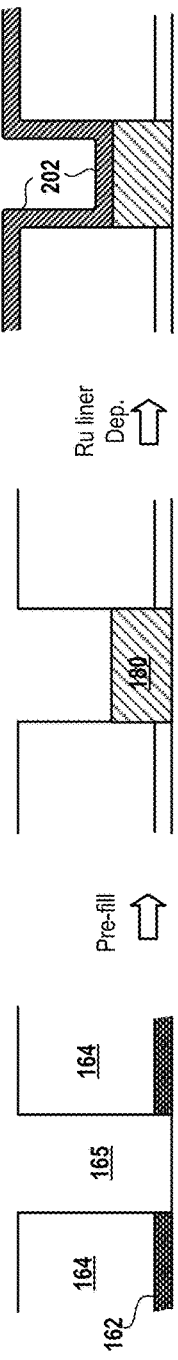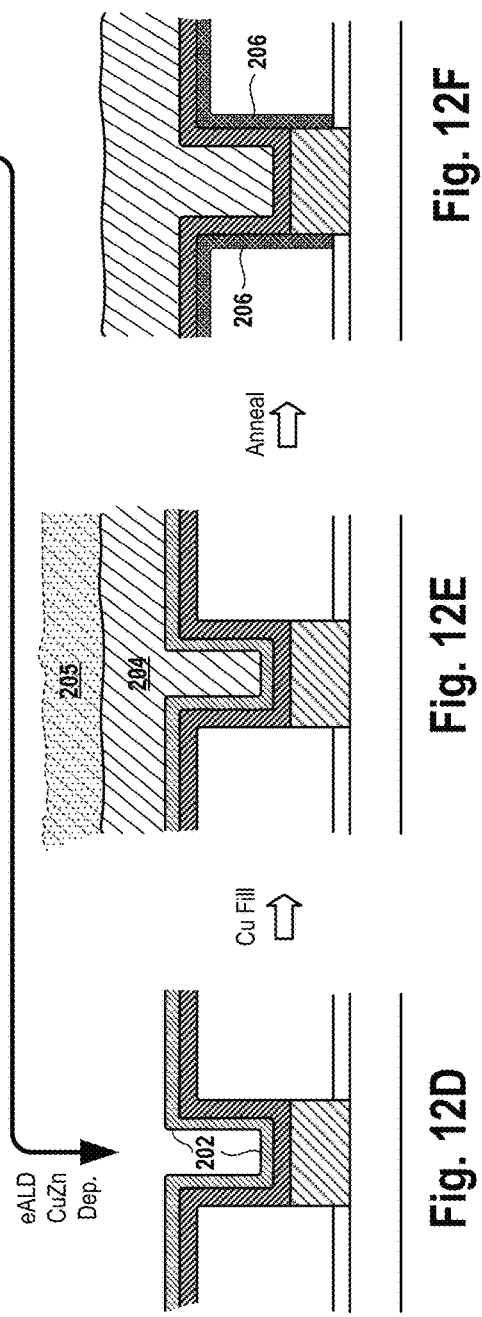

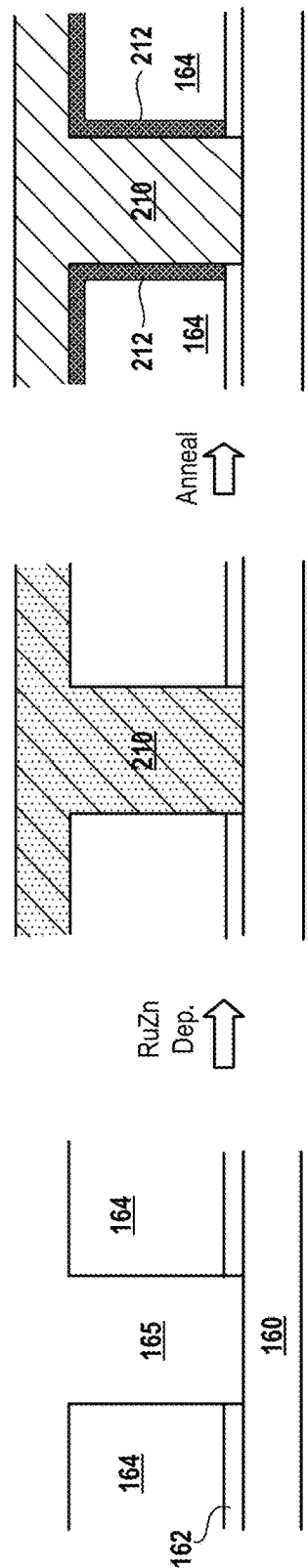

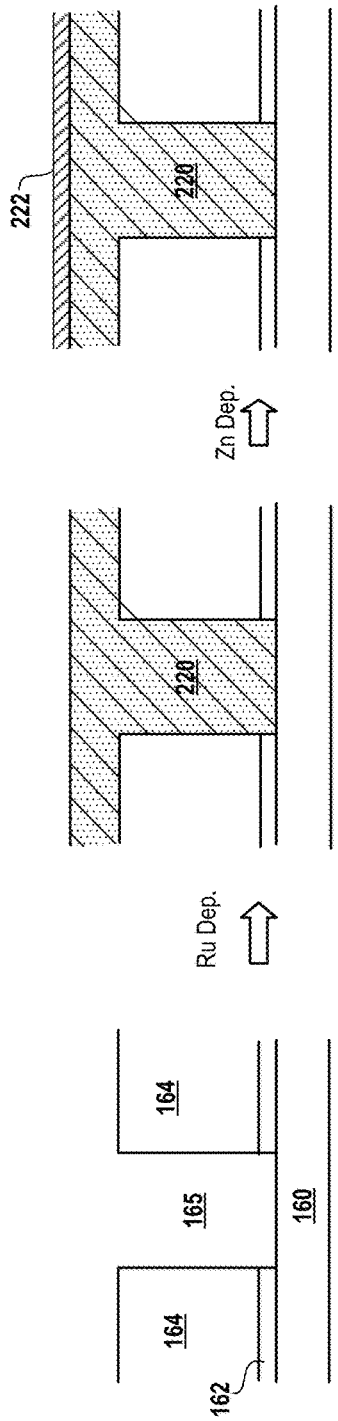

SELF-FORMING BARRIER PROCESS

FIELD OF THE INVENTION

Implementations of the present disclosure relate to a zinc self-forming layer, and related methods, apparatus, and systems.

DESCRIPTION OF THE RELATED ART

A typical current dual-damascene process flow involves depositing a barrier/liner layer (e.g. TaN/Ta, TiN/Ti, etc.) prior to via metallization with Cu. The barrier/liner stack improves adhesion between Cu and oxide/low-k dielectric, and also serves to retard electromigration. The barrier/liner also acts as a diffusion barrier for Cu and is thus needed for reliability. However, the barrier/liner stack at the line/via interface is highly resistive and prevents further scaling as via dimensions shrink.

Currently, via pre-fill using an electroless cobalt process is being explored as an alternative. Although this reduces via resistance compared to the baseline, reliability concerns still exist as there is no interfacial adhesion and diffusion barrier between cobalt and oxide/low-k dielectric. Copper via pre-fill, while technically possible, fails reliability due to poor adhesion between Cu and the dielectric.

SUMMARY

Implementations of the present disclosure provide process flows for via metallization using a M-Zn alloy, where M=Cu, Co or Ni. Metal (M) is doped with an electronegative element (e.g. Zn at about 1 to 30 atomic percent in some implementations; about 1 to 20 atomic percent in some implementations; about 1 to 5 atomic percent in some implementations) which can be driven to the metal oxide interface upon heat treatment where it forms a silicate diffusion barrier. This allows for back-end scaling by mitigating via resistance and via reliability which is a major bottleneck for future technology nodes In some implementations, a method is provided, comprising: performing a deposition process on a substrate, the deposition process configured to deposit a copper layer in a feature on the substrate, the copper layer being doped with zinc at an atomic percentage less than approximately 30 percent; after depositing the copper layer, annealing the substrate, wherein the annealing is configured to cause migration of the zinc to an interface of the copper layer and an oxide layer of the substrate, the migration of the zinc producing an adhesive barrier at the interface that inhibits electromigration of the copper layer.

In some implementations, the feature does not include a barrier layer prior to the deposition of the copper layer.

In some implementations, the annealing of the substrate causes bonding of the zinc to oxygen at the interface to form the barrier.

In some implementations, the annealing of the substrate is performed at a temperature less than approximately 350 degrees Celsius.

In some implementations, the deposition process is defined by an electroless deposition process configured to co-deposit copper and zinc.

In some implementations, the feature is a via, and wherein the method defines a pre-fill operation configured to partially fill the via with the copper layer.

In some implementations, the interface of the copper layer and the oxide layer is defined along a sidewall of the via.

In some implementations, a method is provided, comprising: performing a deposition process on a substrate, the deposition process configured to deposit a metallic layer in a feature on the substrate, the metallic layer consisting of one or more of copper, cobalt, or nickel, and wherein the metal layer is doped with zinc at an atomic percentage less than approximately 5 percent; after depositing the metallic layer, annealing the substrate, wherein the annealing is configured to cause migration of the zinc to an interface of the metallic layer and an oxide layer of the substrate, the migration of the zinc producing a barrier at the interface that inhibits electromigration of the metallic layer.

In some implementations, the feature does not include a barrier layer prior to the deposition of the metallic layer.

In some implementations, the annealing of the substrate causes bonding of the zinc to oxygen at the interface to form the barrier.

In some implementations, the annealing of the substrate is performed at a temperature less than approximately 350 degrees Celsius.

In some implementations, the deposition process is defined by an electroless deposition process.

In some implementations, the feature is a via, and wherein the method defines a pre-fill operation configured to partially fill the via with the metallic layer.

In some implementations, the interface of the metallic layer and the oxide layer is defined along a sidewall of the via.

In some implementations, a method is provided, comprising: performing a first deposition process on a substrate, the first deposition process configured to deposit a copper layer in a feature on the substrate; performing a second deposition process on the substrate, the second deposition process configured to deposit a conformal layer of zinc over the copper layer; annealing the substrate, wherein the annealing is configured to cause migration of the zinc to an interface of the copper layer and an oxide layer of the substrate, the migration of the zinc producing a barrier at the interface that inhibits electromigration of the copper layer.

In some implementations, the feature does not include a barrier layer prior to the deposition of the copper layer.

In some implementations, the annealing of the substrate causes bonding of the zinc to oxygen at the interface to form the barrier.

In some implementations, the annealing of the substrate is performed at a temperature less than approximately 350 degrees Celsius.

In some implementations, the first deposition process is defined by an electroless deposition process configured to deposit copper.

In some implementations, the feature is a via, and wherein the method defines a pre-fill operation configured to partially fill the via with the copper layer.

In some implementations, the interface of the copper layer and the oxide layer is defined along a sidewall of the via.

In some implementations, a method is provided, comprising: performing an electrochemical atomic layer deposition (eALD) process on a substrate, the eALD process configured to deposit a conformal copper seed layer in a feature on the substrate, the copper seed layer being doped with zinc at an atomic percentage less than approximately 5 percent; depositing a copper fill over the copper seed layer; after depositing the copper fill, annealing the substrate, wherein the annealing is configured to cause migration of the zinc to an interface of the copper seed layer and an oxide layer of the substrate, the migration of the zinc producing a barrier at the interface that inhibits electromigration of the copper.

BRIEF DESCRIPTION OF THE DRAWINGS

FIGS. 9A-D conceptually illustrate a process flow for Zn-based via metallization, in accordance with implementations of the disclosure.

FIGS. 10A-D conceptually illustrate a process flow for Zn-based via metallization, in accordance with implementations of the disclosure.

FIGS. 11A-D illustrate a process flow for barrier formation and pre-fill, in accordance with implementations of the disclosure.

FIGS. 12A-F illustrate a process for generating a self-forming zinc-based barrier in a via, in accordance with implementations of the disclosure.

FIGS. 13A-C illustrate a process for generating a self-formed adhesion layer for ruthenium metallization of a via, in accordance with implementations of the disclosure.

FIGS. 14A-D illustrate a process for generating a self-forming adhesion layer for ruthenium metallization, in accordance with implementations of the disclosure.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In keeping with Moore's Law, there has been a continual drive towards smaller and smaller feature sizes in the semiconductor industry. At present, semiconductor manufacturers are commonly producing devices with a 28 nanometer (nm) feature size, or approximately 28 nm pitch. Devices with a 36 nm pitch size are expected to soon. Typically, the pitch is halved every two technology nodes. Thus, it is expected that within about two to three nodes, devices will be at an 18 nm pitch, or about 10 nm feature size or less.

However, as pitch and feature dimensions shrink, so resistance begins to play a larger role in circuit performance. This is attributable to a couple of effects as device features shrink. First, the conductor shrinks when feature sizes a reduced, thereby increasing the resistance. And second, the resistive impact of layers and materials other than the conductor may become more pronounced as feature sizes shrink. This can be due to the fact that in smaller features, the non-conductor materials occupy an increased proportion of the available feature volume relative to that of the conductor material. This can be especially true in the case of a via or interconnect structure.

Figure 1:
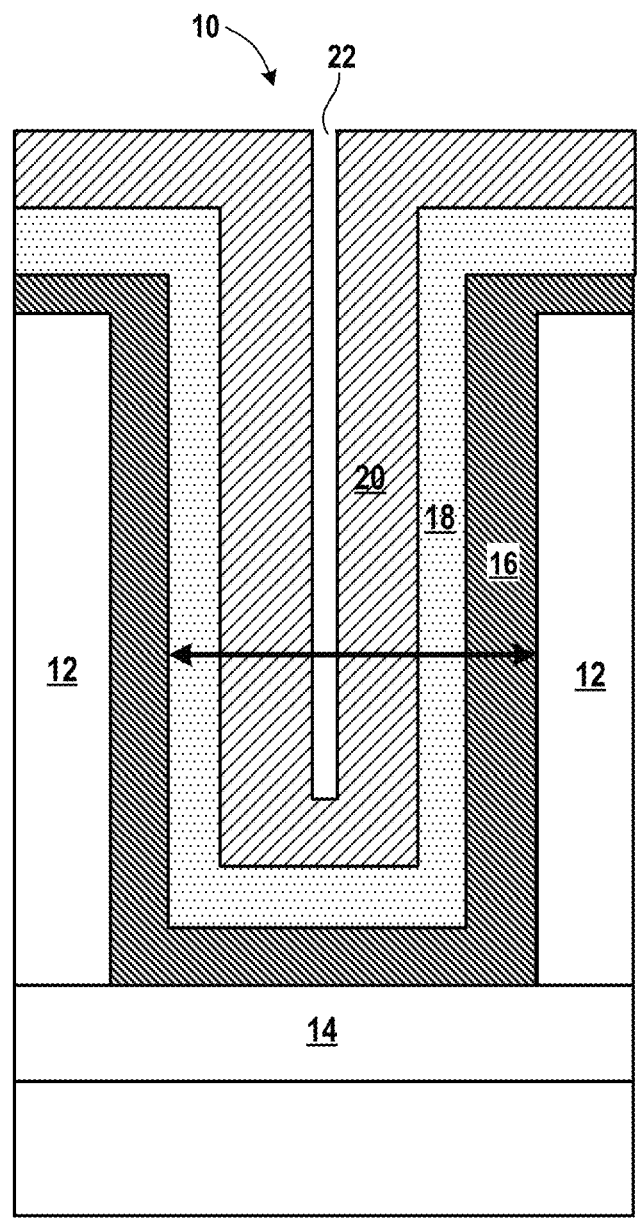
FIG. 1 conceptually illustrates a via/interconnect having various layers of material deposited therein, in accordance with implementations of the disclosure.

FIG. 1 conceptually illustrates a via/interconnect having various layers of material deposited therein, in accordance with implementations of the disclosure. In the illustrated example, the via 10 has an approximate 10 nm feature size (20 nm pitch) and has been processed according to a conventional approach for via fill. The via 10 is patterned in a dielectric material 12 of a substrate, such as an oxide or high-k dielectric material, so as to reach an underlying conductor 14. First, a barrier layer 16 (e.g. TiN, TaN, WN, etc.) is deposited in the via, to prevent diffusion and electromigration of the via conductor 22. Because of poor adhesion between the barrier layer 16 and the conductive material (e.g. Cu) of the later deposited via conductor 22, a liner layer 18 (e.g. Ti, Ta, W, etc.) is deposited over the barrier layer 16 to promote adhesion. Next, a seed layer 20 of the conductive material (e.g. Cu) is deposited over the liner layer 18. The seed layer is typically deposited by a CVD, PVD, or ALD process so as to form a conformal layer and to provide nucleation sites for bulk deposition. Then the bulk deposition/fill (e.g. typically by electroplating) of the conductive material is deposited to form the conductor 22.

However, as conceptually demonstrated by FIG. 1, this typical process scales poorly for small feature sizes such as 10 nm. For the barrier and seed layers consume a significant amount of the cross-sectional space in the via 10, leaving little room for the actual conductor 22. This can be problematic from a processing standpoint as the narrow available space for fill increases the likelihood of the formation of voids during the fill deposition process. Further, the narrow conductor at small feature sizes increases the resistance. Also, the barrier layer 16 acts as a resistive contact between the via structure and the underlying conductor 14. As can be seen, the issue of high resistance is problematic when extending current processes to small feature sizes, as the increased resistance will degrade device performance.

Thus, it would be desirable to enable an interconnect process that provides for a structure consisting of predominantly conductive material to minimize the resistance of the conductor, with a thin barrier that is selectively deposited on the sidewalls only. A metallic contact is desired to act as a flux divergence layer to prevent electromigration.

Implementations of the present disclosure provide methods and systems to address the problems described above which are inherent to conventional processes when extended to 10 nm feature sizes. Broadly speaking, it has been discovered that a low temperature anneal of a zinc-doped conductive layer in an interconnect structure causes the zinc to migrate to the interface with the oxide and form a (self-forming) barrier that prevents electromigration and diffusion of copper, while also improving adhesion. The zinc-doped conductive layer can be deposited by an electrochemical ALD process that provides for conformal coverage.

Figure 2A:
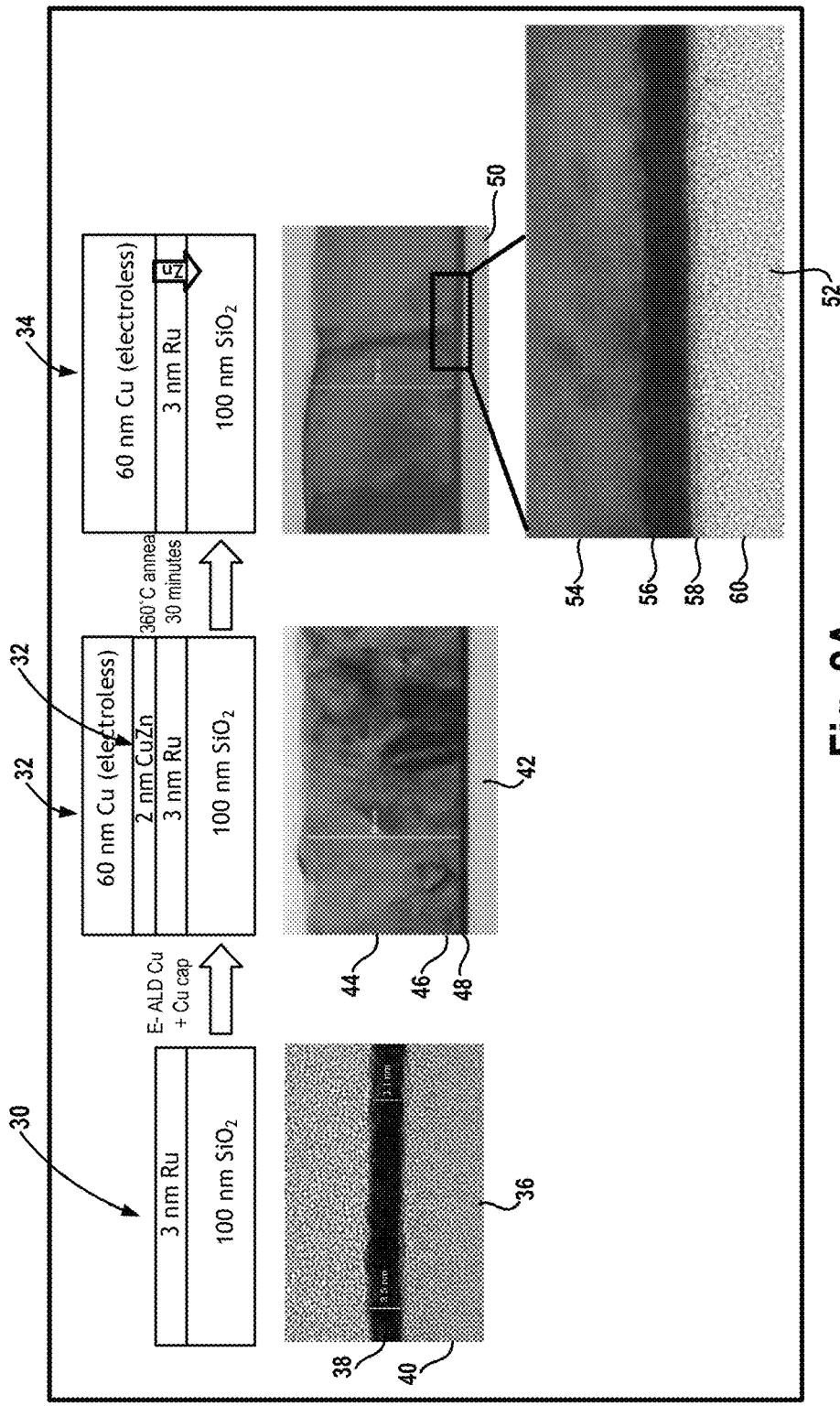
FIG. 2A illustrates a process demonstrating formation of a zinc self-forming barrier on a blanket ruthenium liner on a thermal oxide wafer, in accordance with implementations of the disclosure.

FIG. 2A illustrates a process demonstrating formation of a zinc self-forming barrier on a blanket ruthenium liner on a thermal oxide wafer, in accordance with implementations of the disclosure.

As indicated at reference 30, initially, a 3 nm Ru layer is deposited over a 100 nm (thermal) $SiO_2$ layer. This is further shown by the TEM image 36, which shows the ruthenium layer 38 over the thermal oxide layer 40.

An electrochemical ALD process was performed to deposit a 2 nm layer of zinc-doped copper (CuZn layer), followed by an electroless bulk deposition of a 60 nm layer of copper, resulting in the stack shown at reference 32. This is further shown by the TEM image 42, illustrating the Cu layers at reference 44, positioned over the ruthenium layer 46 and the oxide layer 48.

Next the substrate is annealed at a temperature of 360 degrees Celsius for 30 minutes. This results in a stack as shown at reference 34, wherein the zinc migrates to the interface between the ruthenium and the oxide layers. This is further shown in the TEM image 50, of which an expanded portion is shown at reference 52. In the image 52, the copper layer 54 is seen over the ruthenium layer 56. With a zinc-containing barrier layer 58 now formed at the interface of the ruthenium layer 56 with the oxide layer 60.

Figure 2B:
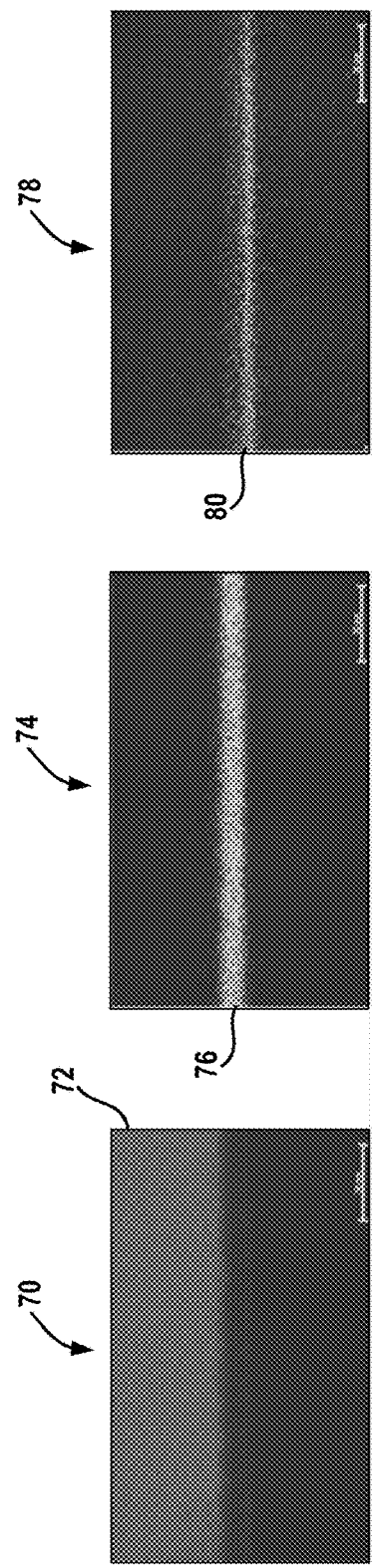
FIG. 2B illustrates a series of STEM EDS (scanning transmission electron microscopy; energy-dispersive x-ray spectroscopy) maps showing the presence of elemental copper, ruthenium, and zinc in the sample processed in accordance with the implementation of FIG. 2A, in accordance with implementations of the disclosure.

FIG. 2B illustrates a series of STEM EDS (scanning transmission electron microscopy; energy-dispersive x-ray spectroscopy) maps showing the presence of elemental copper, ruthenium, and zinc in the sample processed in accordance with the implementation of FIG. 2A, in accordance with implementations of the disclosure. The various EDS maps 70, 74, and 78 are horizontally aligned to show the relative depths of various corresponding elements. The EDS map 70 shows the presence of copper in an upper layer 72. The EDS map 74 shows the presence of elemental ruthenium disposed, as expected, along a layer 76 just below the copper layer 72. However, the EDS map 78 illustrates the presence of zinc primarily in a layer 80 that is below the ruthenium layer 76, despite being originally deposited above the ruthenium layer.

Thus, it can be seen from these results that though the zinc was initially deposited in conjunction with copper over the ruthenium layer, upon the application of the anneal, the zinc in fact migrates through the ruthenium layer to the interface of the ruthenium with the oxide. In this manner, a self-forming barrier is formed by the zinc migration to and accumulation at this interface. Without being bound by any particular theory, it is believed that zinc exhibits an affinity for the oxide, migrating upon anneal and possibly becoming covalently to the oxygen atoms in the thermal silicon dioxide species at the interface.

Figure 2C:
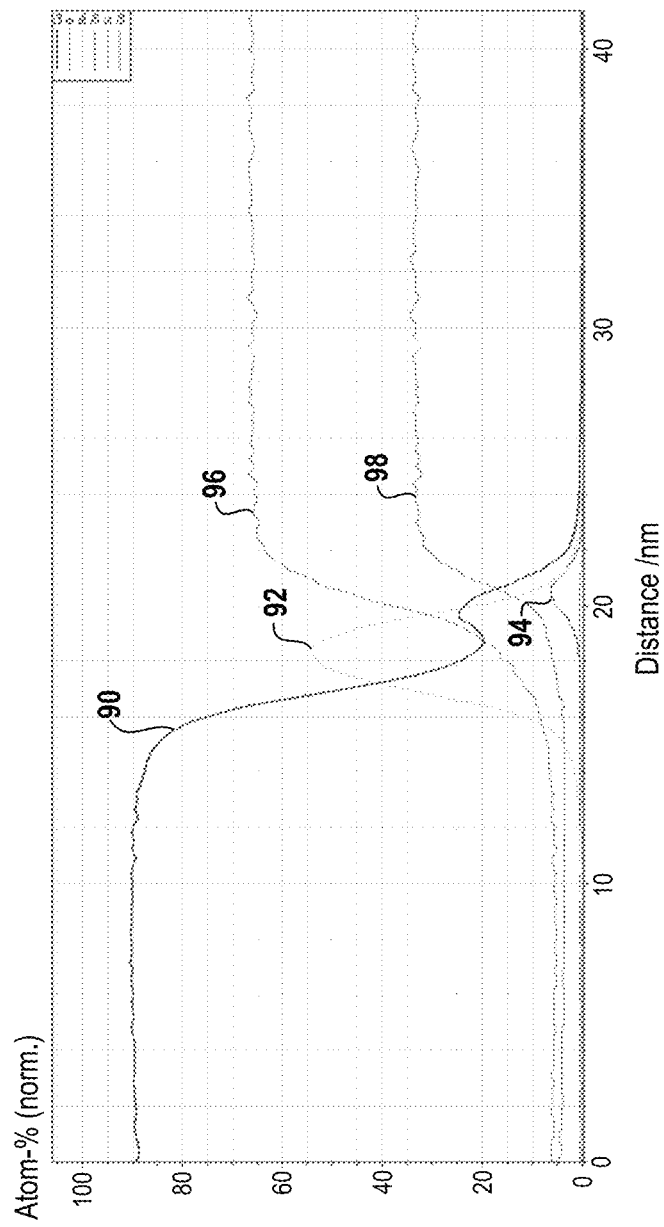
FIG. 2C is an electron energy loss spectroscopy (EELS) profile of the sample processed in accordance with the implementations of FIGS. 2A and 2B, in accordance with implementations of the disclosure.

FIG. 2C is an electron energy loss spectroscopy (EELS) profile of the sample processed in accordance with the implementations of FIGS. 2A and 2B, in accordance with implementations of the disclosure. The plot shown illustrates a depth profile of an approximately 40 nm thickness spanning the copper, ruthenium, zinc, and silicon dioxide layers. The atomic percentage of copper as a function of depth is shown by the curve 90, the atomic percentage of ruthenium by the curve 92, the atomic percentage of zinc by the curve 94, the atomic percentage of oxygen by the curve 96, and the atomic percentage of silicon by the curve 98. As indicated by the various profiles, there is no copper diffusion through the ruthenium-zinc interface into the silicon dioxide. This is significant as it demonstrates the diffusion-inhibiting property of the zinc-containing barrier at the interface of Ru and $SiO_2$.

Figure 3:
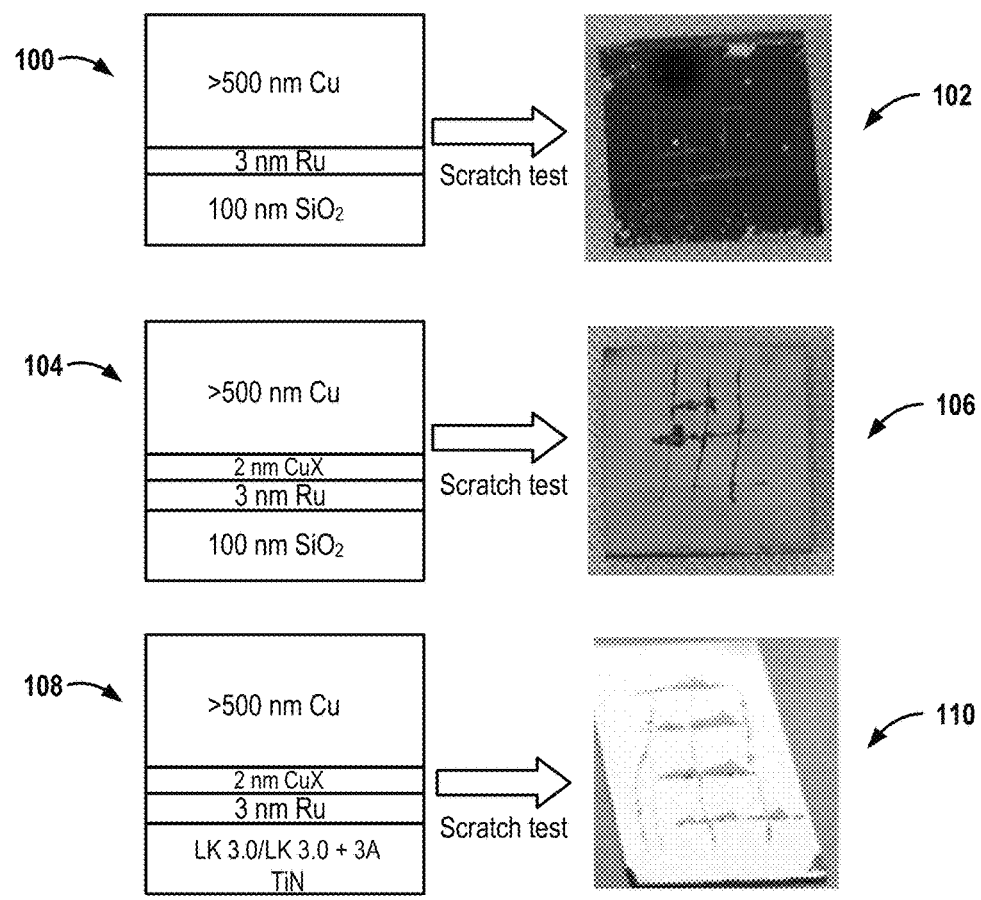
FIG. 3 illustrates adhesion testing of substrates processed according to various methods, in accordance with implementations of the disclosure.

FIG. 3 illustrates adhesion testing of substrates processed according to various methods, in accordance with implementations of the disclosure. As indicated by the stack 100, a first sample was processed to have a 100 nm $SiO_2$ layer, a 3 nm Ru layer, and a copper layer greater than 500 nm. To perform the adhesion testing, samples were scratched with a diamond scribe, and then subjected to a tape test in order to test adhesion. As shown in the image 102, this sample failed the peel test, exhibiting delamination of the copper and ruthenium layers from the substrate sample. Thus, ruthenium directly on $SiO_2$ does not exhibit suitable adhesion.

A second sample was processed so as to have a structure as shown by the stack 104, including a 100 nm thermal oxide layer, a 3 nm ruthenium layer, a 2 nm layer of CuZn (deposited via eALD), and a >500 nm layer of Cu. It will be appreciated that a low temperature anneal was performed to effect migration of the zinc to the interface of the ruthenium with the thermal oxide layer. The result of the adhesion test on this second sample is reflected in the image 106. As shown, adhesion of ruthenium to $SiO_2$ is improved by the presence of the zinc barrier layer. Furthermore, additional dopant (zinc) for CMP adhesion and barrier performance was provided through a CuZn overburden layer.

A third sample was processed as shown by the stack 108, including a low-k 3.0 dielectric, optionally with a 3 angstrom TiN layer, a 3 nm Ru layer, a 2 nm CuZn layer (deposited via eALD), and a >500 nm copper layer. A low temperature anneal was performed. The result of the adhesion test is shown in the image 110, and demonstrates that the zinc self-forming barrier also improves adhesion of ruthenium to a low-k dielectric material. Furthermore, additional dopant (zinc) for CMP adhesion and barrier performance was provided through a CuZn overburden layer.

Figure 4A:
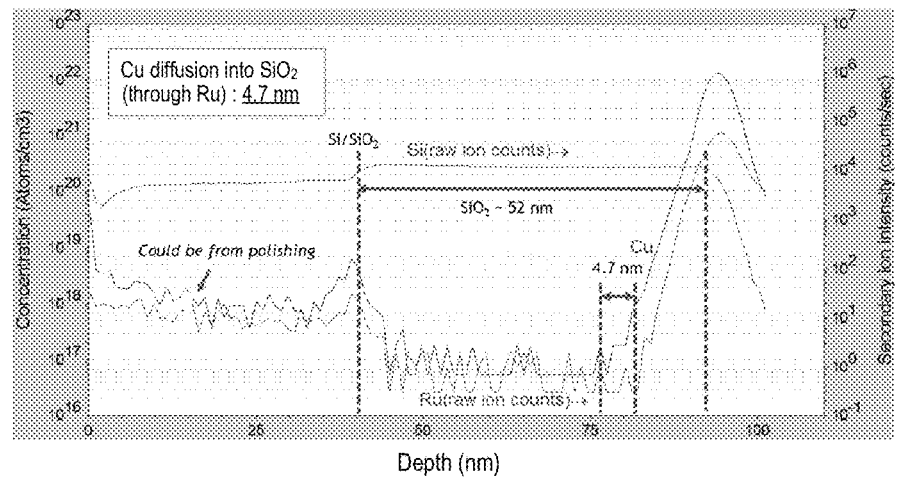
FIGS. 4A and 4B are graphs showing concentration of various elements as a function of depth to study copper diffusion, in accordance with implementations of the disclosure.
Figure 4B:
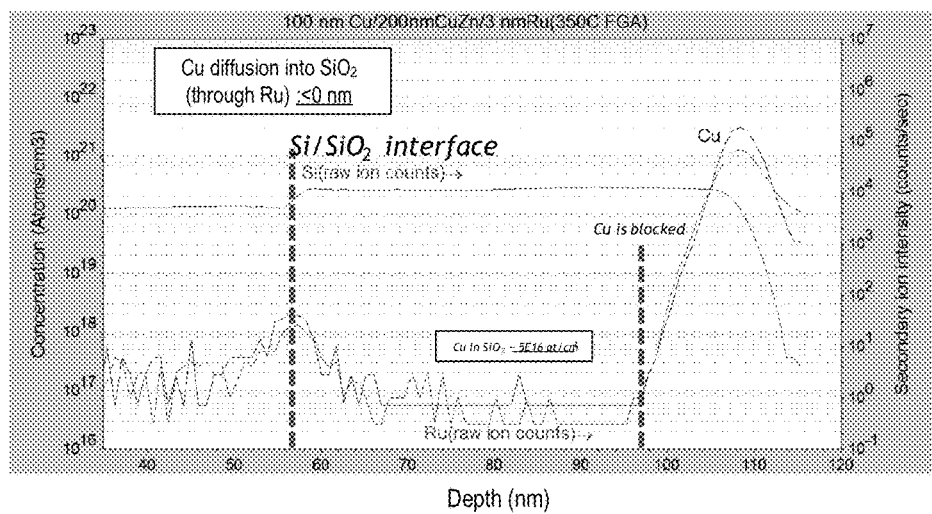

FIGS. 4A and 4B are graphs showing concentration of various elements as a function of depth to study copper diffusion, in accordance with implementations of the disclosure. A backside SIMS (secondary ion mass spectrometry) analysis was carried out on substrates processed with and without a CuZn layer. The backside SIMS technique is useful for studying diffusion of an element as it enables detection of trace amounts of elements by depth profiling from the back side of the substrate.

With reference to FIG. 4A, a depth profile is shown for a substrate having a PVD Cu layer over a Ru layer, over a $SiO_2$ layer. A 30 minute anneal at 350 C was performed. As shown, the Cu was found to have penetrated through the Ru layer and diffused into the $SiO_2$ to an extent of about 4.7 nm.

By contrast, with reference to FIG. 4B, a depth profile is shown for a substrate having a 100 nm PVD Cu layer, over a 200 nm CuZn layer, over a 3 nm Ru layer, over a $SiO_2$ layer. A 30 minute anneal at 350 C was performed. As shown by the depth profile, copper diffusion through Ru into $SiO_2$ was blocked, thus demonstrating both the formation and effectiveness of a barrier to inhibit diffusion.

Figure 5A:
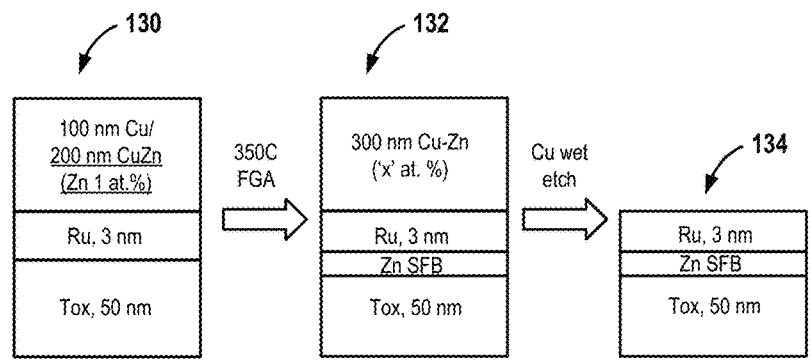
FIGS. 5A and 5B illustrate a process flow for preparation of a substrate, and the results of analysis thereof by XPS (x-ray photoelectron spectroscopy), in accordance with implementations of the disclosure.
Figure 5B:
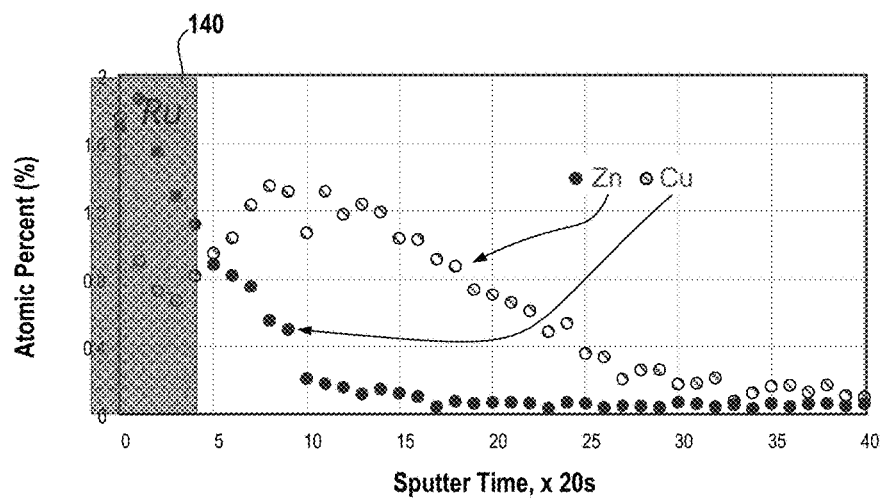

FIGS. 5A and 5B illustrate a process flow for preparation of a substrate, and the results of analysis thereof by XPS (x-ray photoelectron spectroscopy), in accordance with implementations of the disclosure. As indicated at reference 130 of FIG. 5A, initially, a copper stack consisting of 100 nm Cu and 200 nm of CuZn (Zn at 1 atomic percent) was deposited over a 3 nm Ru layer, over a 50 nm layer of thermal oxide. Then a forming gas anneal was performed at 350 C. As indicated at reference 132, this results in the formation of a zinc self-forming barrier at the interface of the Ru and the oxide. Then, in preparation for XPS analysis, a Cu wet etch was performed to remove the copper-containing layers and expose the ruthenium layer, as indicated by the structure as shown at reference 134. This structure was then characterized by XPS analysis.

FIG. 5B illustrates the XPS results for the foregoing sample, showing atomic percentages of Cu and Zn as a function of sputter time, which is indicative of depth. The depth of the ruthenium layer is indicated by the shaded region 140. As shown, the atomic percentage of Zn is in fact greater than the atomic percentage of Cu at profile depths greater than (below) the Ru layer. This indicates that the zinc has migrated through the ruthenium layer to the interfacial region of the thermal oxide with the ruthenium. This also suggests that the zinc that has migrated is acting as a barrier to prevent diffusion of the copper into the thermal oxide.

Figure 6A:
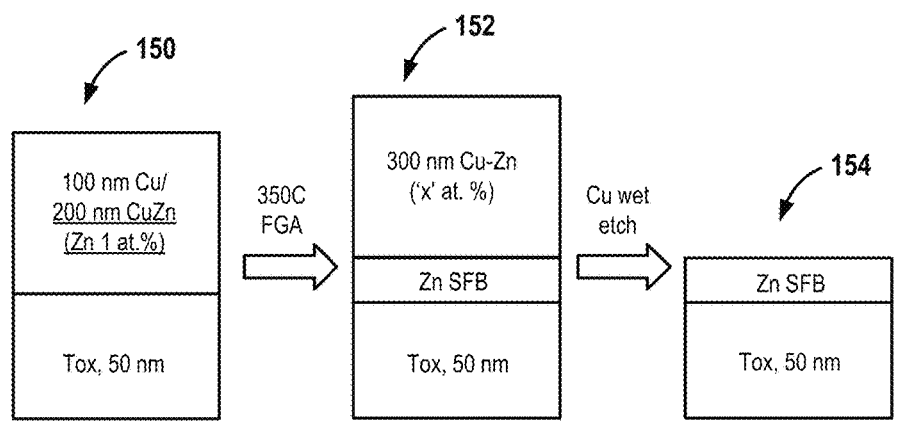
FIGS. 6A-D illustrate a process flow for preparation of a substrate, and corresponding orbital scan results, in accordance with implementations of the disclosure.

FIGS. 6A-D illustrate a process flow for preparation of a substrate, and corresponding orbital scan results, in accordance with implementations of the disclosure. With reference to FIG. 6A, the illustrated process flow was carried out to obtain a zinc self-formed barrier for analysis. As indicated by the structure shown at reference 150, initially a 100 nm Cu layer and a 200 nm CuZn (Zn at one atomic percent) were deposited over a 50 nm layer of thermal oxide. Then, a forming gas anneal at 350 C was performed, causing migration of zinc to the oxide-copper interface to form a Zn self-forming barrier, as shown by the structure at reference 152. Then a wet etch was performed to remove the copper-containing layers, exposing the zinc barrier, as shown by the structure at reference 154.

Figure 6B:
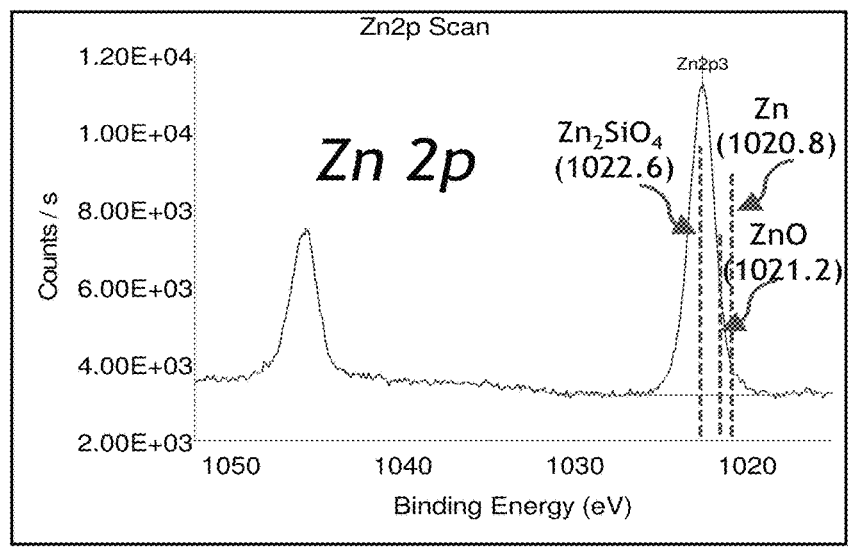
Figure 6C:
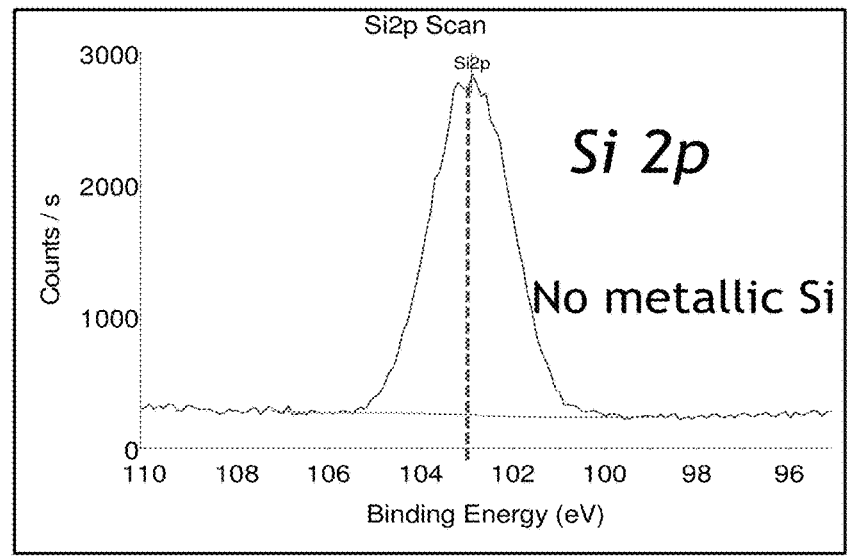
Figure 6D:
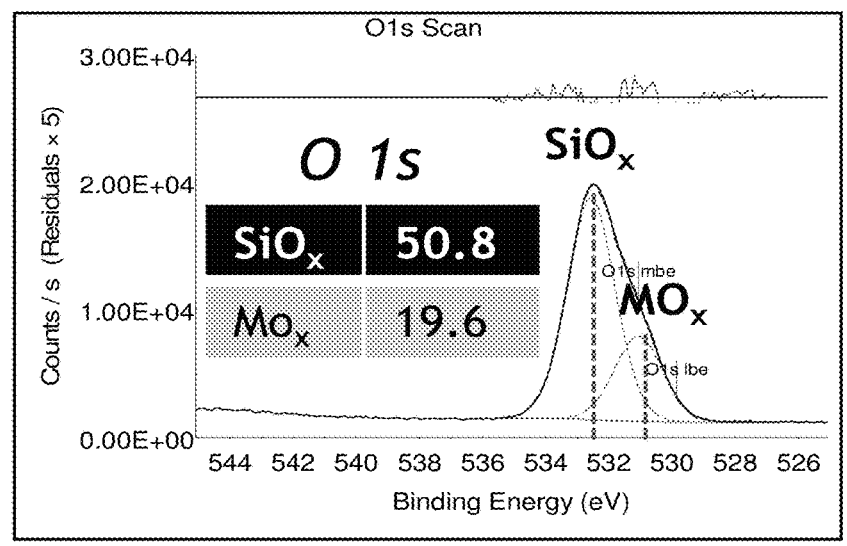

FIGS. 6B-D are graphs showing the results of XPS analysis for specific orbital peaks of the various elements. FIG. 6B demonstrates that the Zn 2p orbital peak has been positively shifted from what would be expected for purely elemental Zn, meaning that the zinc has undergone oxidation. FIG. 6C demonstrates that the Si 2p orbital peak has not shifted from its expected value in the +4 oxidation state. FIG. 6D demonstrates that the O 1s orbital peak exhibits some negative broadening suggesting that some of the oxygen is being reduced. In sum, it is shown that zinc is being oxidized, silicon is not being reduced, and there is evidence that some oxygen is being reduced. Thus, without being bound by any particular theory of explanation, it is believed that zinc is bound to oxygen at the thermal oxide interface, possibly through covalent bonding, and that this forms the structure of the self-formed barrier.

Figure 7:
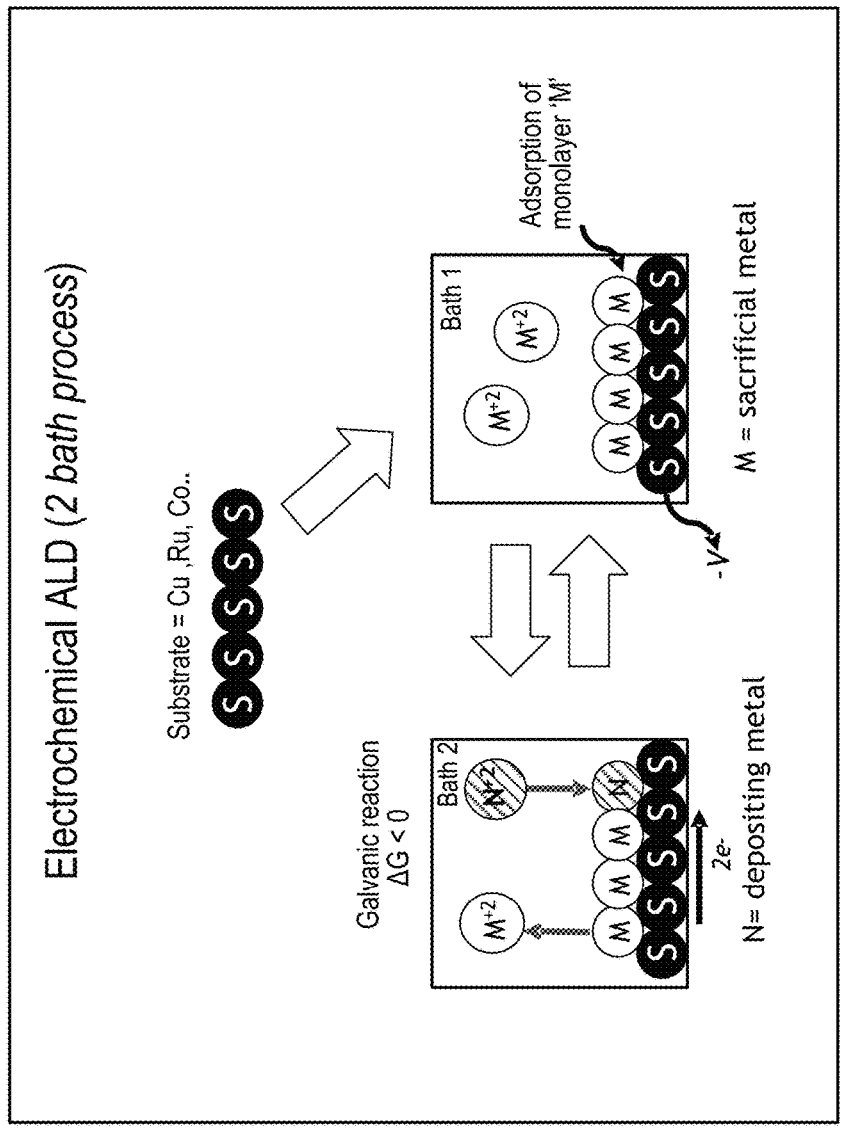
FIG. 7 conceptually illustrates an eALD process using two separate baths, in accordance with implementations of the disclosure.

As noted herein, implementations of the present disclosure employ an electrochemical atomic layer deposition (eALD) process. FIG. 7 conceptually illustrates an eALD process using two separate baths, in accordance with implementations of the disclosure. Electrochemical ALD is typically an atmospheric wet process used to deposit conductive metallic films. Substrate materials are typically transition/noble metals. With reference to FIG. 7, a substrate 'S' is placed in a first bath, whereupon a monolayer of a sacrificial metal 'M' is adsorbed on the substrate. Then the substrate is placed into a second bath, whereupon a depositing metal 'N' displaces the sacrificial metal 'M' on the substrate surface. Both reactions are self-limiting and therefore monolayer selectivity and deposition control is achieved.

Figure 8:
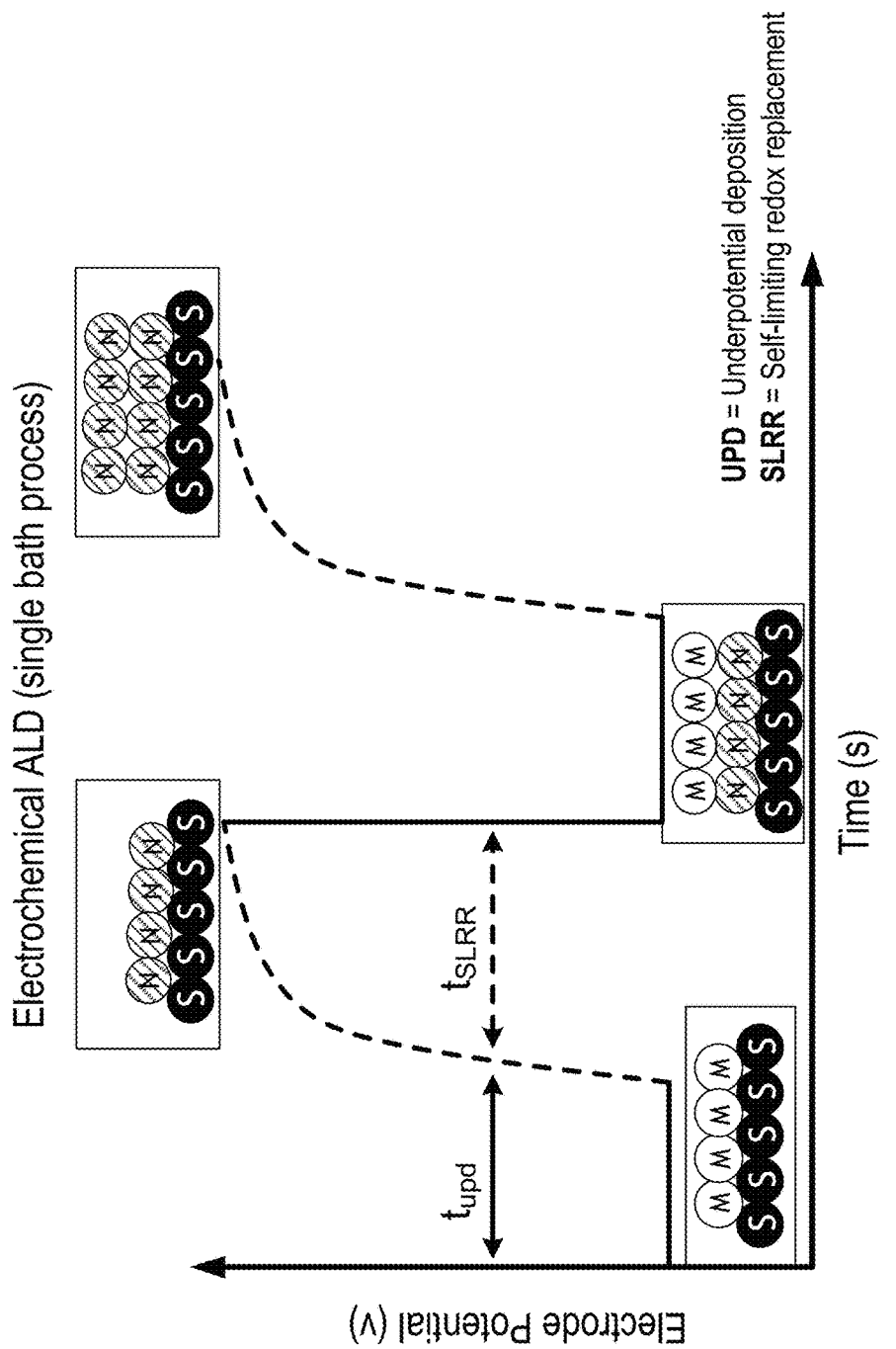
FIG. 8 is a graph conceptually illustrating a potential driven eALD process, in accordance with implementations of the disclosure.

While the above-described eALD process employs two separate baths, in some implementations, eALD is performed in a single bath. FIG. 8 is a graph conceptually illustrating a potential driven eALD process, in accordance with implementations of the disclosure. Broadly speaking, eALD in a single bath is enabled by potential pulsing, to selectively promote the two phases of the deposition process. During a first phase or time '$t_{upd}$' the potential is held at a level that promotes monolayer adsorption of the sacrificial metal 'M' on the substrate while avoiding bulk deposition. This is referred to as an underpotential deposition. Following this, during second phase or time '$t_{SLRR}$' the potential is raised to a level that promotes a self-limiting redox replacement of the sacrificial metal 'M' with the depositing metal 'N.' At the conclusion of this phase, the potential is reduced to initiate the next cycle. In this manner, eALD in a single bath is enabled by sequentially pulsing the potential. Co-deposition at the cathodic potential is prevented by kinetically retarding the depositing metal plating reaction.

As noted, implementations of the present disclosure provide for the deposition of a zinc-doped copper film. This can be accomplished by eALD, wherein the sacrificial metal is zinc, and the depositing metal is copper. The eALD process is configured so that incomplete replacement of zinc with copper occurs during the redox replacement phase, resulting in a conformal copper film that is doped with a certain amount of zinc (e.g. about one to five atomic percent in some implementations; about one to 20 atomic percent in some implementations; about one to 30 atomic percent in some implementations).

Through growth and characterization studies, it has been found that the growth rate of eALD copper on planar ruthenium is approximately 0.8 to 1 angstrom of thickness per cycle, which translates to about a third of a monolayer per eALD cycle. It is believed that anion co-adsorption and incomplete self-limiting redox replacement prevents full monolayer coverage in a single cycle.

In sum, as noted above, an eALD process can be configured to incorporate a certain percentage of zinc into a conformal copper film. It should be noted that upon formation of the film, in the presence of oxygen, then the zinc will tend to migrate to the exposed surface and passivate the eALD Cu film. However, in the absence of oxygen or absent exposure to oxygen (e.g. via an additional layer to prevent exposure) the zinc will remain in the Cu film. Upon the performance of an anneal, typically in a reducing environment, the zinc will migrate to an underlying oxide interface and form a self-forming barrier. This migration can include movement of the zinc through underlying metallic layers such as through a ruthenium layer to the ruthenium-oxide interface. There is evidence of a reaction of the zinc with the oxide at the interface, providing improved adhesion properties. Furthermore, the self-forming barrier defined by the zinc inhibits Cu migration through the oxide. This has been demonstrated with a 1% Zn doped film of CuZn at 2 nm thickness.

In view of the foregoing, various process flows are contemplated for via metallization using a M-Zn alloy, where M=Cu, Co or Ni. Metal (M) is doped with an electronegative element (such as Zn, 1-5 at. %) which can be driven to the metal oxide interface upon heat treatment where it forms a silicate diffusion barrier. This allows for back-end scaling by mitigating via resistance and via reliability which is a major bottleneck for future technology nodes.

Implementations of the present disclosure address the via resistance and reliability issues. Specifically, implementations of the present disclosure provide a pathway for enabling Cu via pre-fill which yields lower via resistance than cobalt. Furthermore, via reliability which prevented implementation of Cu via pre-fill is addressed by the Zn self-forming barrier/adhesion layer. This adhesion layer between Cu and dielectric retards electromigration, improving reliability.

Implementations of the disclosure also improve electromigration, diffusion and adhesion characteristics of electroless cobalt or nickel via pre-fill flow. Zinc doped in cobalt or nickel diffuses to the metal/dielectric interface creating an adhesive layer which retards metal diffusion and electromigration.

Doping of the metal fill with approximately 1-5% Zn, e.g. via eALD, has been performed, and the mobility of Zn in the Cu matrix has been discovered. It has been found that the direction of Zn mobility can be controlled such that Zn is driven to the oxygen interface, through the liner (e.g. Ru) to the liner/oxide interface by heating in a reducing environment where it forms a silicate barrier. These observations allow several integration flows for via metallization using Cu, Co or Ni doped with Zn.

FIGS. 9A-D conceptually illustrate a process flow for Zn-based via metallization, in accordance with implementations of the disclosure. In the illustrated implementation, Zn is doped using an electroless co-deposition process for M-Zn with Zn content ranging from about 1 to 5 atomic percent (or about 1 to 20 or 30 atomic percent in some implementations). Shown at FIG. 9A is a cross section of a portion of a substrate having an etched via 165 prior to fill processing. The via 165 is configured to enable formation of an interconnect to an underlying copper line 160. The via 165 has been etched from a dielectric layer 164, and an etch stop layer and/or capping layer has been etched/removed from the bottom of the via, to expose the copper line 160.

With reference to FIG. 9B, a pre-fill operation is performed by electroless deposition, so as to (partially) fill the via 165 with a M-Zn material to form a pre-fill layer 166. It will be appreciated that in various implementations, the metal M can be a conductive metal such as copper, cobalt, nickel, etc. or an alloy. The M-Zn material includes zinc at a concentration of about 1 to 5 atomic percent (or about 1 to 20 or 30 atomic percent in some implementations). The pre-fill operation fills the bottom portion of the via 165, effectively reducing the aspect ratio of the feature.

Following the pre-fill operation, an anneal is performed, which causes the zinc to migrate to the interface of the pre-fill layer with the dielectric along the sidewalls of the via. With reference to FIG. 9C, a zinc-based barrier/adhesion layer 168 is thereby formed at the dielectric interface.

Following these operations, as the aspect ratio of the via has been effectively reduced, in accordance with implementations of the disclosure as shown with reference to FIG. 9D, then a conventional dual-damascene process flow may be employed. Such a dual-damascene process flow may initiate with deposition of a barrier/liner 170, providing conformal coverage over the dielectric and the pre-fill layer 166.

FIGS. 10A-D conceptually illustrate a process flow for Zn-based via metallization, in accordance with implementations of the disclosure. FIG. 10A illustrates a cross section of a portion of a substrate having an etched via 165 prior to being filled, so as to enable connection to an underlying conductor line 160.

With reference to FIG. 10B, a via pre-fill operation is performed, partially filling the via 165 with a conductive material (e.g. Cu, Co, Ni, etc. or an alloy) to form a pre-fill layer 180. In some implementations, the conductive material of the pre-fill layer 180 is a pure or substantially pure metal, that is not doped with zinc. In some implementations, the pre-fill operation is performed via an electroless deposition process. In other implementations, the pre-fill operation is performed via other deposition processes.

Subsequent to the via pre-fill operation, a conformal layer of zinc, or a layer having a high concentration of zinc (e.g. about 20 atomic percent zinc or greater), is deposited over the via, as indicated at FIG. 10C, forming a zinc layer 182. Then a heat treatment or anneal operation is performed. This causes at least some of the zinc to be driven through the metal pre-fill layer 180 to the metal-dielectric interface, where it forms a zinc based barrier/adhesion layer 184, as shown at FIG. 10D.

Though in the foregoing implementation, it is generally contemplated that the pre-fill is not doped with zinc, in some other implementations, the pre-fill metal is doped with zinc. The subsequently deposited conformal zinc layer 182 thus provides additional zinc for the formation of the barrier/adhesion layer, and provides for formation of the zinc barrier/adhesion layer along other regions of the dielectric additional to the metal-dielectric interface regions.

Subsequent to the process flow of the instant implementation, a dual-damascene process flow can be performed.

FIGS. 11A-D illustrate a process flow for barrier formation and pre-fill, in accordance with implementations of the disclosure. As in the foregoing implementations, at FIG. 11A, the etched via 165 is shown. Then, as shown at FIG. 11B, a conformal or semi-conformal layer 190 of Zn is deposited first in the via 165. Subsequently, a heat treatment or anneal is performed that promotes reflow and formation of the self-forming barrier/adhesion layer 192, as shown at FIG. 11C. Then, as shown at FIG. 11D, via prefill is performed in the subsequent step by a deposition process such as electroless deposition, to deposit a pre-fill layer 194 of conductive material in the via 165.

Subsequent to the process flow of the instant implementation, a dual-damascene process flow can be performed.

The above-described implementations of the present disclosure address the issues of diffusion and poor adhesion of via pre-fill layers by providing a self-forming barrier/adhesion layer that is minimally consumptive of the available via width. This maximizes the volume of the pre-fill conductive material while addressing the aforementioned issues, thereby reducing resistance of the via structure and improving device performance.

In some implementations, the process flow for barrier/adhesion layer formation and pre-fill is enabled by wet deposition processes, such as electrochemical plating and/or electroless deposition.

Since the formation of the Zn-based adhesion layer is important in accordance with the presently described process flows, process equipment could utilize heating hardware in combination with wet deposition hardware (e.g. RTA, flash anneal, etc.).

FIGS. 12A-E illustrate a process for generating a self-forming zinc-based barrier in a via, in accordance with implementations of the disclosure. With reference to FIG. 12A, after performance of etch and clean processes, a cross section of a via 165 that has been etched from a dielectric 164 is shown. The via 165 is configured to enable connection to an underlying conductor 160, that consists of a conductive material such as copper. An etch stop layer 162 has been removed at the bottom of the via, exposing the underlying conductor 160 for contact with subsequently deposited material.

With reference to FIG. 12B, a via pre-fill operation is performed, to deposit in the via 165 a pre-fill layer 180 consisting of a conductive material (e.g. Cu, Co, alloy, etc.). The pre-fill operation is configured to partially fill the via 165, so that the pre-fill layer 180 occupies a bottom portion of the via 165.

With reference to FIG. 12C, a ruthenium liner 200 is deposited over the via. In some implementations, the Ru liner 200 is deposited to have a thickness in the range of about 1 to 3 nm; in some implementations, 1 to 2 nm. The Ru liner 200 is deposited by a conformal deposition method, e.g. CVD, ALD, electroplating. The Ru liner 200 provides a boundary to the conductors which it is adjacent to, acting as a flux divergence layer and inhibiting electromigration.

With reference to FIG. 12D, a copper-zinc (CuZn) seed layer 202 is deposited by electrochemical ALD (eALD). The CuZn seed layer 202 is principally a copper seed layer doped with a small percentage of zinc. In some implementations, the CuZn layer 202 is deposited to have a thickness in the range of about 2 to 3 nm. Further, in some implementations, the amount of zinc in the Cu—Zn layer 202 is in the range of about 1 to 5 atomic percent. It will be appreciated that the eALD process is specifically configured to incorporate zinc in the film at the chosen atomic percentage.

With reference to FIG. 12E, a copper fill operation is performed, to deposit a copper fill layer 204 over the via. The copper fill operation is performed via electrochemical plating, electroless deposition, or another deposition method suitable for bulk deposition of copper. In some implementations, optionally, an additional CuZn overburden layer 205 is deposited over the copper fill layer 204 (e.g. via eALD, electrochemical plating, or electroless deposition). The additional CuZn overburden layer 205 is configured to provide additional zinc for the purpose of generating the zinc self-formed barrier/adhesion layer.

In some implementations, a reflow operation is performed instead of, or in addition to, the cupper fill operation noted above. The reflow operation can be configured to cause reflow of the CuZn seed layer 202, and/or the Cu fill layer 204.

With reference to FIG. 12F, a heat treatment or anneal operation is performed. This causes the zinc present in the CuZn seed layer, and optionally in the CuZn overburden layer if present, to be driven through the metallic layers to the oxide dielectric, where it reacts to form the self-formed barrier/adhesion layer 206. In some implementations, the anneal is performed at a temperature less than about 350 C. In some implementations, the anneal is performed at a temperature between about 40 and 450 C; in some implementations, between about 75 to 200 C; in some implementations, between about 75 to 150 C; in some implementations, about 150 C; in some implementations, between about 250 to 400 C; in some implementations, between about 300 to 350 C. In some implementations, the anneal is performed for a time of about 2 to 30 minutes; in some implementations, about 3 to 10 minutes; in some implementations, about 5 minutes. In some implementations, a flash anneal is performed, which achieves annealing very rapidly, on the order of milliseconds.

In some implementations, a two-part anneal process is employed, wherein a first anneal is performed at a first comparatively lower temperature (e.g. 50 to 100 C in some implementations), followed by a second anneal performed at a second comparatively higher temperature (e.g. 200 to 350 C in some implementations). Because copper can also migrate under annealing conditions, a single anneal of sufficiently high temperature may undesirably enable some copper to migrate into the dielectric before zinc migrates sufficiently to prevent this. However, as zinc migrates significantly faster than copper at lower temperatures, then a first low temperature anneal can be configured to enable at least a portion of the zinc to migrate to the interface with the dielectric before copper reaches the dielectric. Then a second comparatively higher temperature anneal speeds the migration process of the remaining zinc, without risk of copper diffusing into the dielectric.

In some implementations, the zinc mobility described herein can be leveraged to enable other types of metallization. For example, ruthenium is known to possess desirable properties in terms of diffusion and electromigration, thereby theoretically obviating the need for barrier layers to address these issues as in other metallization materials such as copper. However, poor adhesion of ruthenium to other materials remains a challenge and has limited the potential application of ruthenium for metallization. Implementations of the present disclosure improve adhesion of ruthenium to oxide-containing dielectric through the formation of a self-formed adhesion layer, as described below.

FIGS. 13A-C illustrate a process for generating a self-formed adhesion layer for ruthenium metallization of a via, in accordance with implementations of the disclosure. FIG. 13A illustrates a cross section of a portion of a substrate showing an etched via 165 from a dielectric 164, that is configured to enable connection to an underlying conductor 160.

With reference to FIG. 13B, a deposition process is performed to deposit a layer 210 of ruthenium that is doped with zinc. The deposition is configured to fill the via 165, and may be performed via eALD in some implementations. In some implementations, the quantity of zinc present in the layer 210 is approximately 1 to 5 atomic percent. In some implementations, the quantity of zinc present in the layer 210 is approximately 1 to 20 or 30 atomic percent. Subsequently, an anneal or heat treatment operation is performed to drive the zinc to the dielectric interface. As shown at FIG. 13C, this results in formation of a self-formed zinc-based adhesion layer 212 at the interface between the ruthenium layer 210 and the dielectric 164. The adhesion layer 212 improves the adhesion of the ruthenium to the dielectric, thereby improving device reliability.

FIGS. 14A-D illustrate a process for generating a self-forming adhesion layer for ruthenium metallization, in accordance with implementations of the disclosure. FIG. 14A illustrates a portion of a substrate having a via 165, following etch and clean processing. Then a ruthenium deposition process is performed, so as to deposit a layer 220 of ruthenium in the via 165, as shown at FIG. 14B.

Subsequently, with reference to FIG. 14C, a layer 222 of zinc is deposited over the layer 220. Then an anneal or heat treatment process is performed, causing the zinc to migrate through the ruthenium layer to the dielectric interface, where it forms a self-forming adhesion layer 224. The adhesion layer 224 provides for improved adhesion between the ruthenium and the dielectric, thus improving device reliability.

Figure 15:
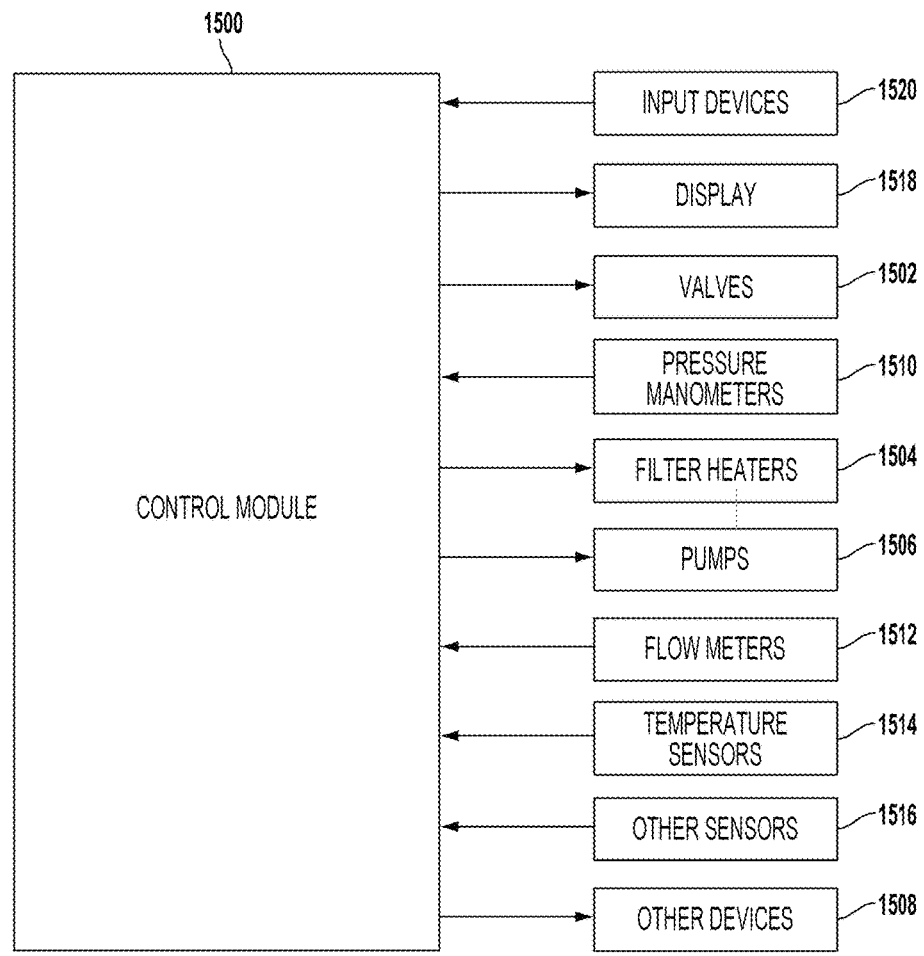
FIG. 15 shows a control module for controlling the systems described above, in accordance with implementations of the disclosure.

FIG. 15 shows a control module 800 for controlling systems for performing operations described above, in accordance with implementations of the disclosure. For instance, the control module 1500 may include a processor, memory and one or more interfaces. The control module 1500 may be employed to control devices in the system based in part on sensed values. For example only, the control module 1500 may control one or more of valves 1502, filter heaters 1504, pumps 1506, and other devices 1508 based on the sensed values and other control parameters. The control module 1500 receives the sensed values from, for example only, pressure manometers 1510, flow meters 1512, temperature sensors 1514, and/or other sensors 1516. The control module 1500 may also be employed to control process conditions during reactant delivery and plasma processing. The control module 1500 will typically include one or more memory devices and one or more processors.

The control module 1500 may control activities of the reactant delivery system and plasma processing apparatus. The control module 1500 executes computer programs including sets of instructions for controlling process timing, delivery system temperature, pressure differentials across the filters, valve positions, mixture of gases, chamber pressure, chamber temperature, wafer temperature, RF power levels, wafer ESC or pedestal position, and other parameters of a particular process. The control module 1500 may also monitor the pressure differential and automatically switch vapor reactant delivery from one or more paths to one or more other paths. Other computer programs stored on memory devices associated with the control module 1500 may be employed in some embodiments.

Typically there will be a user interface associated with the control module 1500. The user interface may include a display 1518 (e.g. a display screen and/or graphical software displays of the apparatus and/or process conditions), and user input devices 1520 such as pointing devices, keyboards, touch screens, microphones, etc.

Computer programs for controlling delivery of reactant, plasma processing and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

Although the foregoing embodiments have been described in some detail for purposes of clarity of understanding, it will be apparent that certain changes and modifications may be practiced within the scope of the disclosed embodiments. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method, comprising:
performing a deposition process on a substrate, the deposition process configured to deposit a copper layer in a feature on the substrate, the copper layer being doped with zinc at an atomic percentage less than approximately 30 percent;
after depositing the copper layer, annealing the substrate, wherein the annealing is configured to cause migration of the zinc to an interface at an oxide layer of the substrate, the migration of the zinc producing an adhesive barrier at the interface that inhibits electromigration of the copper layer.

2. The method of claim 1, wherein the feature does not include a barrier layer prior to the deposition of the copper layer.

3. The method of claim 1, wherein the annealing of the substrate causes bonding of the zinc to oxygen at the interface to form the barrier.

4. The method of claim 1, wherein the annealing of the substrate is performed at a temperature less than approximately 350 degrees Celsius.

5. The method of claim 1, wherein the deposition process is defined by an electroless deposition process configured to co-deposit copper and zinc.

6. The method of claim 1, wherein the feature is a via, and wherein the method defines a pre-fill operation configured to partially fill the via with the copper layer.

7. The method of claim 6, wherein the interface is defined along a sidewall of the via.

8. A method, comprising:
performing a deposition process on a substrate, the deposition process configured to deposit a metallic layer in a feature on the substrate, the metallic layer consisting of one or more of copper, cobalt, or nickel, and wherein the metal layer is doped with zinc at an atomic percentage less than approximately 5 percent;
after depositing the metallic layer, annealing the substrate, wherein the annealing is configured to cause migration of the zinc to an interface of the metallic layer and an oxide layer of the substrate, the migration of the zinc producing a barrier at the interface that inhibits electromigration of the metallic layer.

9. The method of claim 8, wherein the feature does not include a barrier layer prior to the deposition of the metallic layer.

10. The method of claim 8, wherein the annealing of the substrate causes bonding of the zinc to oxygen at the interface to form the barrier.

11. The method of claim 8, wherein the annealing of the substrate is performed at a temperature less than approximately 350 degrees Celsius.

12. The method of claim 8, wherein the deposition process is defined by an electroless deposition process.

13. The method of claim 8, wherein the feature is a via, and wherein the method defines a pre-fill operation configured to partially fill the via with the metallic layer.

14. The method of claim 13, wherein the interface of the metallic layer and the oxide layer is defined along a sidewall of the via.

15. A method, comprising:
performing a first deposition process on a substrate, the first deposition process configured to deposit a copper layer in a feature on the substrate;
performing a second deposition process on the substrate, the second deposition process configured to deposit a conformal layer of zinc over the copper layer;

annealing the substrate, wherein the annealing is configured to cause migration of the zinc to an interface at an oxide layer of the substrate, the migration of the zinc producing a barrier at the interface that inhibits electromigration of the copper layer.

16. The method of claim 15, wherein the feature does not include a barrier layer prior to the deposition of the copper layer.

17. The method of claim 15, wherein the annealing of the substrate causes bonding of the zinc to oxygen at the interface to form the barrier.

18. The method of claim 15, wherein the annealing of the substrate is performed at a temperature less than approximately 350 degrees Celsius.

19. The method of claim 15, wherein the first deposition process is defined by an electroless deposition process configured to deposit copper.

20. The method of claim 15, wherein the feature is a via, and wherein the method defines a pre-fill operation configured to partially fill the via with the copper layer.

21. The method of claim 20, wherein the interface is defined along a sidewall of the via.

22. The method of claim 1, wherein the interface is an interface of the copper layer and the oxide layer of the substrate.

23. The method of claim 1,
wherein the feature includes a ruthenium layer prior to the deposition of the copper layer, and wherein the interface is an interface of the ruthenium layer and the oxide layer of the substrate.

* * * * *